US012238866B2

(12) United States Patent
White et al.

(10) Patent No.: US 12,238,866 B2
(45) Date of Patent: Feb. 25, 2025

(54) SYSTEMS AND METHODS PROVIDING HIGH-DENSITY MEMORY ARRANGEMENTS WITH HIGH-SPEED INTERCONNECTS IN A CONDENSED FORM FACTOR

(71) Applicant: TORmem Inc., San Jose, CA (US)

(72) Inventors: Steven White, Morgantown, WV (US); Thao An Nguyen, San Jose, CA (US)

(73) Assignee: TORmem Inc., San Jose, CA (US)

( * ) Notice: Subject to any disclaimer, the term of this patent is extended or adjusted under 35 U.S.C. 154(b) by 0 days.

(21) Appl. No.: 18/659,657

(22) Filed: May 9, 2024

(65) Prior Publication Data

US 2024/0306305 A1 Sep. 12, 2024

Related U.S. Application Data

(63) Continuation of application No. 17/811,616, filed on Jul. 11, 2022, now Pat. No. 11,997,792.

(51) Int. Cl.
*H05K 1/18* (2006.01)
*H05K 1/02* (2006.01)
*H05K 7/20* (2006.01)

(52) U.S. Cl.
CPC ........... *H05K 1/183* (2013.01); *H05K 1/0272* (2013.01); *H05K 7/20272* (2013.01); *H05K 7/20772* (2013.01); *H05K 2201/064* (2013.01); *H05K 2201/10159* (2013.01); *H05K 2201/10416* (2013.01)

(58) Field of Classification Search
CPC .. H05K 1/0272; H05K 1/183; H05K 7/20272; H05K 7/20772; H05K 2201/064; H05K 2201/10159; H05K 2201/10416
See application file for complete search history.

(56) References Cited

U.S. PATENT DOCUMENTS

| | | | |
|---|---|---|---|
| 7,318,322 B2 * | 1/2008 | Ota | H05K 7/20781 62/305 |
| 2005/0133214 A1 * | 6/2005 | Pfahnl | F28D 1/0535 165/185 |
| 2008/0084667 A1 | 4/2008 | Campbell et al. | |
| 2008/0163631 A1 | 7/2008 | Campbell et al. | |
| 2008/0310104 A1 * | 12/2008 | Campbell | H05K 7/20781 29/729 |
| 2013/0135812 A1 | 5/2013 | Barina et al. | |

(Continued)

*Primary Examiner* — Nathan Milakovich
(74) *Attorney, Agent, or Firm* — Ansari Katiraei LLP; Arman Katiraei; Sadiq Ansari

(57) ABSTRACT

A high-density memory system includes at least one memory-dense compute unit with a printed circuit board ("PCB") having a half-width one rack unit ("1U") form factor, more than 20 memory module slots arranged depth-wise from a front to a rear of the PCB with a horizontal orientation that is parallel to the half-width 1U form factor, at least one processor positioned in between the memory module slots, a dripless connector with a first port that receives a cooling solution from a manifold of a cooling unit and a second port that returns the cooling solution into the manifold, tubing that extends the full length of the PCB from the first port past the memory module slots and the at least one processor and back to the second port, and cooling blocks that are located in between the memory module slots and that are connected to the tubing.

20 Claims, 10 Drawing Sheets

(56) References Cited

U.S. PATENT DOCUMENTS

| | | |
|---|---|---|
| 2015/0055301 A1 | 2/2015 | So et al. |
| 2016/0345469 A1* | 11/2016 | Begolli .................. F04D 17/16 |
| 2022/0369513 A1 | 11/2022 | Franz et al. |
| 2023/0301022 A1 | 9/2023 | Gao |

* cited by examiner

SYSTEMS AND METHODS PROVIDING HIGH-DENSITY MEMORY ARRANGEMENTS WITH HIGH-SPEED INTERCONNECTS IN A CONDENSED FORM FACTOR

CLAIM OF BENEFIT TO RELATED APPLICATIONS

This application is a continuation of U.S. nonprovisional application Ser. No. 17/811,616 with the title "Systems and Methods Providing High-Density Memory Arrangements with High-Speed Interconnects in a Condensed Form Factor", filed Jul. 11, 2022. The contents of application Ser. No. 17/811,616 are hereby incorporated by reference.

BACKGROUND

The amount of memory that may be installed on a server or other compute device may be constrained by the physical space available on the compute device motherboard, the arrangement of the motherboard components, and/or heat considerations. These constraints may be exacerbated when the server or other compute device is confined to a specific form factor such as a one rack unit ("1U") form factor. For instance, a server in a full-width 1U form factor may be 1.75 inches tall, 12-24 inches wide, and 24-48 inches deep, while a server in a half-width 1 IU form factor has half the physical area and is therefore even more limited as to the number of memory modules that may be placed alongside the central processing unit ("CPU"), storage devices, networking components, input/output interfaces, graphical processing unit ("GPU"), other processors and/or components. The confined space also hinders cooling by restricting the airflow around the heat generating components. Consequently, general purpose motherboards for the 1U form factor may have a maximum memory capacity of 4 terabytes because of the size limitations and heat constraints.

DETAILED DESCRIPTION OF PREFERRED EMBODIMENTS

Figure 1:
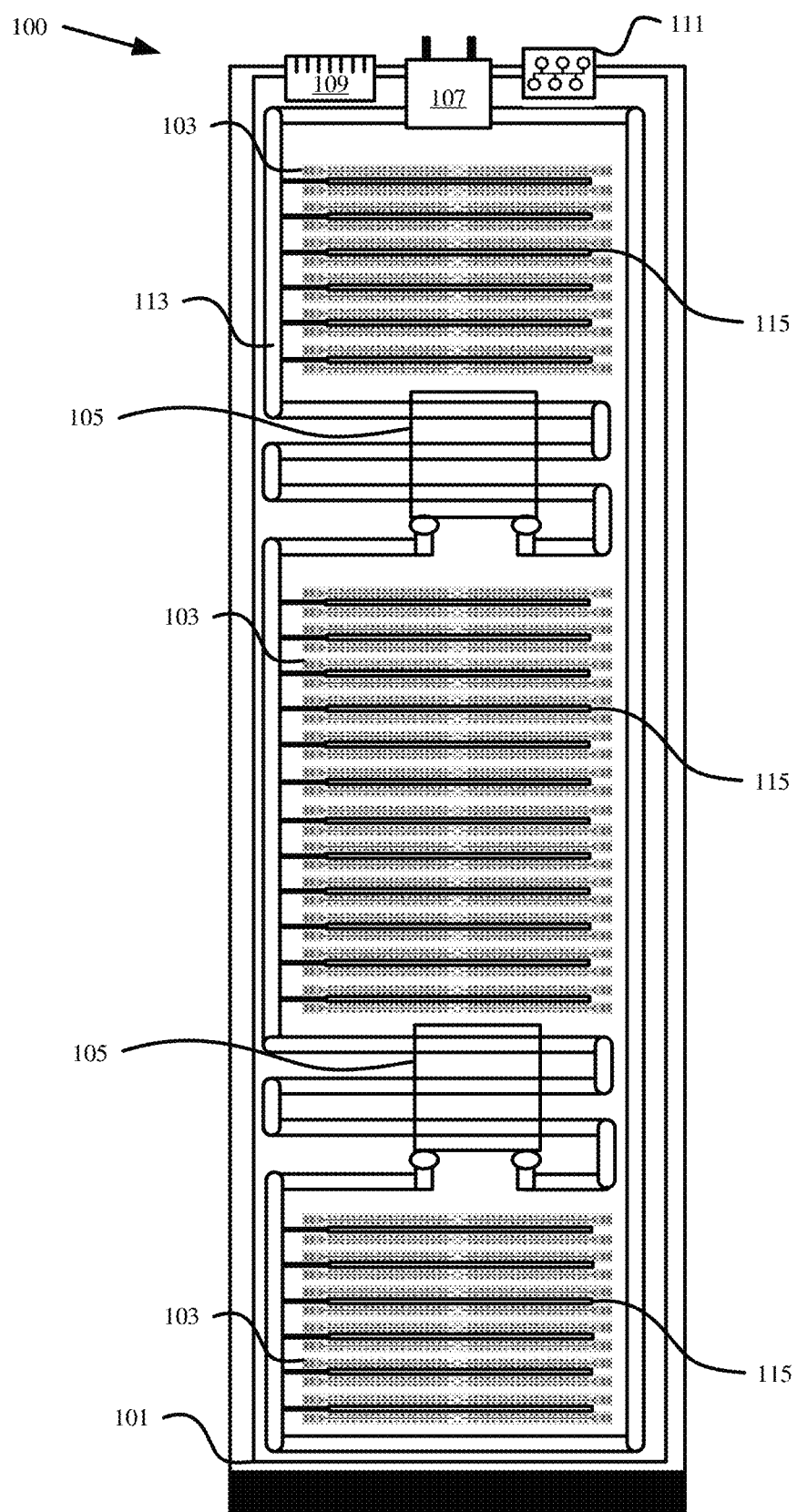
FIG. 1 illustrates an example architecture for a memory-dense compute unit in accordance with some embodiments presented herein.

The following detailed description refers to the accompanying drawings. The same reference numbers in different drawings may identify the same or similar elements.

Disclosed are systems and methods that provide high-density memory arrangements with high-speed interconnects in a condensed form factor. The systems and methods may include one or more memory-dense compute units and a cooling unit.

The memory-dense compute units may interchangeably connect to one another via a high-speed interconnect fabric to form a massive memory installation within a single rack or chassis. More specifically, the connected memory-dense compute units may provide hundreds of terabytes ("TBs") of memory from two or more rack units of a rack or chassis, and the combined memory pool may be allocated to and/or accessed by one or more applications, services, processes, and/or processors running on one or more of the memory-dense compute units.

The memory-dense compute units may also connect to the cooling unit via a detachable liquid cooling coupler or connector. The cooling unit may pump a cooling solution across the high-density memory arrangements of each connected memory-dense compute unit to keep each compute unit cool and operational despite having tens of memory modules and one or more processors positioned next to one another in a condensed form factor.

In some embodiments, each memory-dense compute unit may include a specialized motherboard or printed circuit board ("PCB") with one or more processors and a dense arrangement of up to 48 or more Dual In-line Memory Modules ("DIMMs"), Random Access Memory ("RAM") modules, and/or other physical memory modules in a half-width one rack unit ("1U") form factor, wherein the memory-dense compute unit in the half-width 1U form factor may have a height of 1.75 inches, a width between 6-12 inches, and a depth of 24-48 inches. In some such embodiments, each memory-dense compute unit may support 24 TBs or more of memory, and two half-width memory-dense compute units may be inserted side-by-side in a 1U slot of a rack or chassis. Accordingly, connecting four such memory-dense compute units to the same high-speed interconnect switching fabric may create a combined memory pool of 96 TBs or more from just a two slot or two rack unit ("2U") allocation of space from a single rack or chassis.

In some embodiments, each memory-dense compute unit may include high-speed interconnects for connecting to a high-speed interconnect switch in order to create the larger combined memory pool. The high-speed interconnect switch may be integrated in the chassis backplane of each memory-dense compute unit or a set of two or more memory-dense compute units that are inserted in the same chassis. In some embodiments, two or more chassis with two or more memory-dense compute units may be linked together based on connections between the chassis backplanes.

The high-speed interconnects may use Compute Express Link ("CXL") and/or Peripheral Component Interconnect Express ("PCIe") connectivity to allow any processor from a connected set of memory-dense compute units to directly access memory from any memory-dense compute unit of the connected set of memory-dense compute unit while maintaining memory coherence. Moreover, the CXL and PCIe connectivity may provide remote memory access performance that is equivalent or similar to accessing the local memory from a single motherboard or the local memory of a single memory-dense compute unit.

In some embodiments, each memory-dense compute unit may include cooling tubes and blocks interweaving and contacting each of the processors and memory modules, and a cooling connector for connecting the cooling tubes and blocks to a manifold of the cooling unit. Once the memory-dense compute unit is connected to the cooling unit, the cooling connector may receive a cooling solution from the cooling unit. The cooling solution may flow through the cooling tubes and blocks contacting each of the installed memory modules and processors. The cooling solution removes heat from each installed memory module and processor of the memory-dense compute unit, and returns to the cooling unit via the cooling connector where it is once again cooled before cycling back through each of the memory-dense compute units that are connected to cooling unit manifold. The cooling unit may be contained within a separate full length and full width 1U to 4U form factor, and may be added to the same rack or chassis as the one or more memory-dense compute units that connect to the cooling unit and that connect to one another via the high-speed interconnect switch to form the massive memory pool.

Accordingly, the systems and methods may provide hundreds of TBs, and potentially, petabytes of memory from a single rack or chassis. The massive memory pool may be accessed by the one or more processors of the memory-dense compute units that contribute to the massive memory pool, and may be directly accessed as if the entirety of the combined memory pool was local to the processors and/or without a performance penalty associated with a processor on a first memory-dense compute unit accessing a block of memory from a memory module of a second memory-dense compute unit.

FIG. 1 illustrates an example architecture for a memory-dense compute unit 100 in accordance with some embodiments presented herein. Memory-dense compute unit 100 may be housed within a blade, sled, tray, and/or other case with a half-width 1U form factor. In other words, memory-dense compute unit 100 may occupy half of one slot within a server rack or chassis. Memory-dense compute unit 100 may include specialized motherboard or PCB 101 with up to 48 depth-wise and/or horizontally aligned memory module slots 103 positioned on either side of one or more processors 105 or processor sockets. The depth-wise and/or horizontal alignment may position memory module slots 103 to be parallel with a front face of the rack or chassis, and/or to deviate by 90 degrees from a length-wise or vertical alignment. The length-wise or vertical alignment of memory modules is used for forced-air cooling implementations because the length-wise or vertical alignment of memory modules creates fewer obstructions for air flowing from the front to the back (or back to front) of the PCB 101 than a depth-wise and/or horizontal alignment or memory modules. However, the length-wise or vertical alignment of memory modules provides a less dense arrangement of memory modules than the depth-wise or horizontal alignment of memory modules in the half-width or full-width 1U form factor.

Each memory module slot 103 of PCB 101 may be separated by as little as 10 millimeters from neighboring memory module slots 103. Each memory module slot 103 may receive a DIMM, RAM module, and/or other physical memory module. Each memory module slot 103 may support the maximum amount of memory that is contained by a single memory module. For instance, current capacity of a memory module may be 512 gigabytes ("GBs"). However, the memory module capacity may increase such that each memory module contains one or more TBs. Each memory module slot 103 may also support the maximum memory module speed or rating. For instance, each memory module slot 103 may support Double Data Rate 5 Synchronous Dynamic Random-Access Memory ("DDR-5 SDRAM") modules with a clock rate of 6 gigahertz ("GHz").

One or more processors 105 may include central processing units ("CPUs"), graphical processing unit ("GPUs"), and/or other integrated circuits that perform computations and/or other processing operations based on data that is stored in memory. Each processor 105 may manage a separate bank of memory modules. For instance, first processor 105 may manage access to memory installed in the first 24 memory module slots 103, and second processor 105 may manage access to memory installed in the second 24 memory module slots 103.

The rear of memory-dense compute unit 100 may include cooling connector 107, power connector 109, and high-speed interconnect interface 111. These connectors 107 and 109 and interface 111 allow for memory-dense compute unit 100 to be interchangeably inserted into and out from a rack or chassis, and allow memory-dense compute unit 100 to be linked to other memory-dense compute units 100 that are connected to the same rack or chassis, to receive power from the rack or chassis, and/or to be actively cooled by a cooling unit installed on the same rack or chassis without any manual user configuration, wiring, or user-established connectivity. Memory-dense compute unit 100 may be inserted into a slot of the rack or chassis to connect cooling connector 107 to the manifold of the cooling unit, power connector 109 to a power supply or power interface, and high-speed interconnect interface 111 to a PCIe switch. In some embodiments, the switch may be located in the chassis backplane and one or more memory-dense compute units 100 may be connected to the chassis backplane (e.g., high-speed interconnect interface 111 of the one or more memory-dense compute units 100 may connect to a different port of the PCIe switch that is integrated in the chassis backplane).

Cooling connector 107 may include a dripless and/or quick disconnect connector. Cooling connector 107 may have a first port for receiving the cooling solution from the cooling unit, and a second port for returning the cooling solution back to the cooling unit once the cooling solution has circulated through memory-dense compute unit 100 and has absorbed heat from each of the memory modules, processors, and/or other heat generating components of memory-dense compute unit 100.

Tubing 113 may be used to circulate the cooling solution from the first port of cooling connector 107 over the entire layout of memory-dense compute unit 100 and back to the second port. Specifically, tubing 113 may route across, through, or past each memory module slot 103 and processor 105 of memory-dense compute unit 100. In some embodiments, tubing 113 supplies the cooling solution to or through cooling blocks 115 that are aligned with each memory module slot 103, that abut each installed memory module, and/or that abut each processor 105.

Each cooling block 115 may include a thermal interface material, a liquid-cooled heatsink, or other structure that makes surface contact with one side of an installed memory module or processor 105. The cooling solution passes through cooling block 115 to cool or transfer heat away from the side that is in direct contact with one side of the memory module or processor 105.

Figure 2:
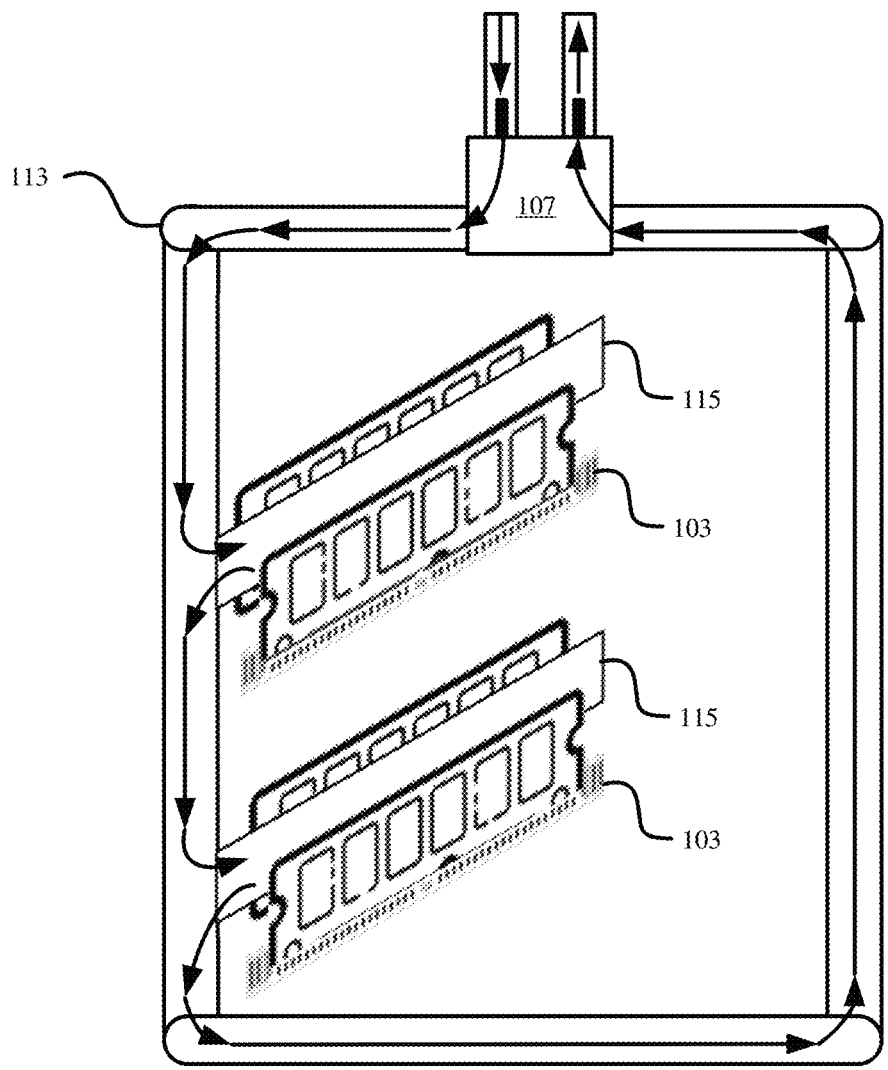
FIG. 2 illustrates an example of liquid cooling a high-density memory arrangement in accordance with some embodiments presented herein.

FIG. 2 illustrates an example of liquid cooling the high-density memory arrangement via cooling connector 107, tubing 113, and cooling block 115 in accordance with some embodiments presented herein. As shown in FIG. 2, tubing 113 may connect to the first port of cooling connector 107, and may route between or past multiple memory module slots 103. Tubing 113 may feed the cooling solution through one end of a connected cooling block 115 that is positioned between two or more memory module slots 103. In other words, cooling block 115 may be sandwiched between two memory modules or cooling block 115 may be positioned to directly abut one or more memory modules from one or more sides in order to draw heat away from the contacted memory modules, thereby cooling the memory modules. Specifically, the cooling solution enters an interior of cooling block 115 where it cools one or more abutting memory modules before exiting cooling block 115 and circulating through the remaining length of tubing 113. In some embodiments, tubing 113 may receive the cooling solution on an opposite end or an output port of cooling block 115 after heat has been transferred away from the abutting memory modules. Tubing 113 continues feeding the cooling solution to other connected cooling blocks 115 in other parts of memory-dense compute unit 100. In some embodiments, tubing 113 may route the cooling solution along a single path. In some other embodiments, tubing 113 may divert the cooling solution across multiple paths to better balance the cooling of components (e.g., memory modules and/or processors 105) at the front and rear of memory-dense compute unit 100.

In some embodiments, cooling block 115 may have a thermal interface material that is spongy, flexible, and/or compressible and through which the cooling solution may flow without being directly exposed or transferred to the contacted components or electronics. In some embodiments, cooling block 115 may have a hollow interior and an exterior housing formed from aluminum, copper, and/or another thermally conductive material. The thermally conductive material may aid in absorbing heat away from another surface that comes into contact with the thermally conductive exterior, and the cooling solution passing along the interior of the thermally conductive exterior may transfer the heat off the exterior surface. Cooling block 115 may have a rectangular shape to match the size and shape of the memory modules.

With reference back to FIG. 1, power connector 109 may include a male or female coupler that connects to an opposite male or female couple at the rear of the rack or chassis. Power connector 109 may be used to supply power from the rack or chassis to memory-dense compute unit 100. In some embodiments, power connector 109 may supply a 12 Volt ("V") or 48V direct current ("DC") to power operation of the installed memory modules and processors 105.

High-speed interconnect interface 111 may provide CXL connectivity via a PCIe interface to connect memory-dense compute unit 100 to other memory-dense compute units 100. Specifically, high-speed interconnect interface 111 may include a port or interface that connects to a CXL switch or a PCIe switch within the backplane of the chassis containing one or more memory-dense compute units 100. High-speed interconnect interface 111 may provide 32 PCIe lanes with up to 64 gigabit per second ("Gbps") or gigatransfers per second ("GT/s") of throughput on each PCIe lane. The processors of one memory-dense compute unit 100 may access the installed memory on one or more other memory-dense compute units 100 on the same PCIe communication bus with the same or similar performance as accessing local memory due to the extremely low latency and extremely high throughput links provided by the PCIe communication bus.

Although not shown in FIG. 1, memory-dense compute unit 100 may also include one or more input/output ports, such as Universal Serial Bus ("USB") ports, for directly connecting to and/or managing memory-dense compute unit 100, and/or a network port, such as an Ethernet port, for remotely accessing and/or managing memory-dense compute unit 100. Memory-dense compute unit 100 may include other components or elements, or a different arrangement of the disclosed components. For instance, memory-dense compute unit 100 may include more or less memory module slots 103, more or less processors 105, different types of processors (e.g., a CPU and a GPU), temperature sensors for monitoring the temperature at different parts of memory-dense compute unit 100, and/or flow regulators for adjusting the flow of the cooling solution or the amount of cooling provided to different parts of memory-dense compute unit 100 based on the monitored temperature. In some embodiments, the flow regulators may include electronically controlled valves for diverting the cooling solution across different sections of tubing 113, or may include an interface for communicating with the cooling unit to adjust the pump pressure and/or the rate of cooling solution supplied to memory-dense compute unit 100 via cooling connector 107.

Figure 3:
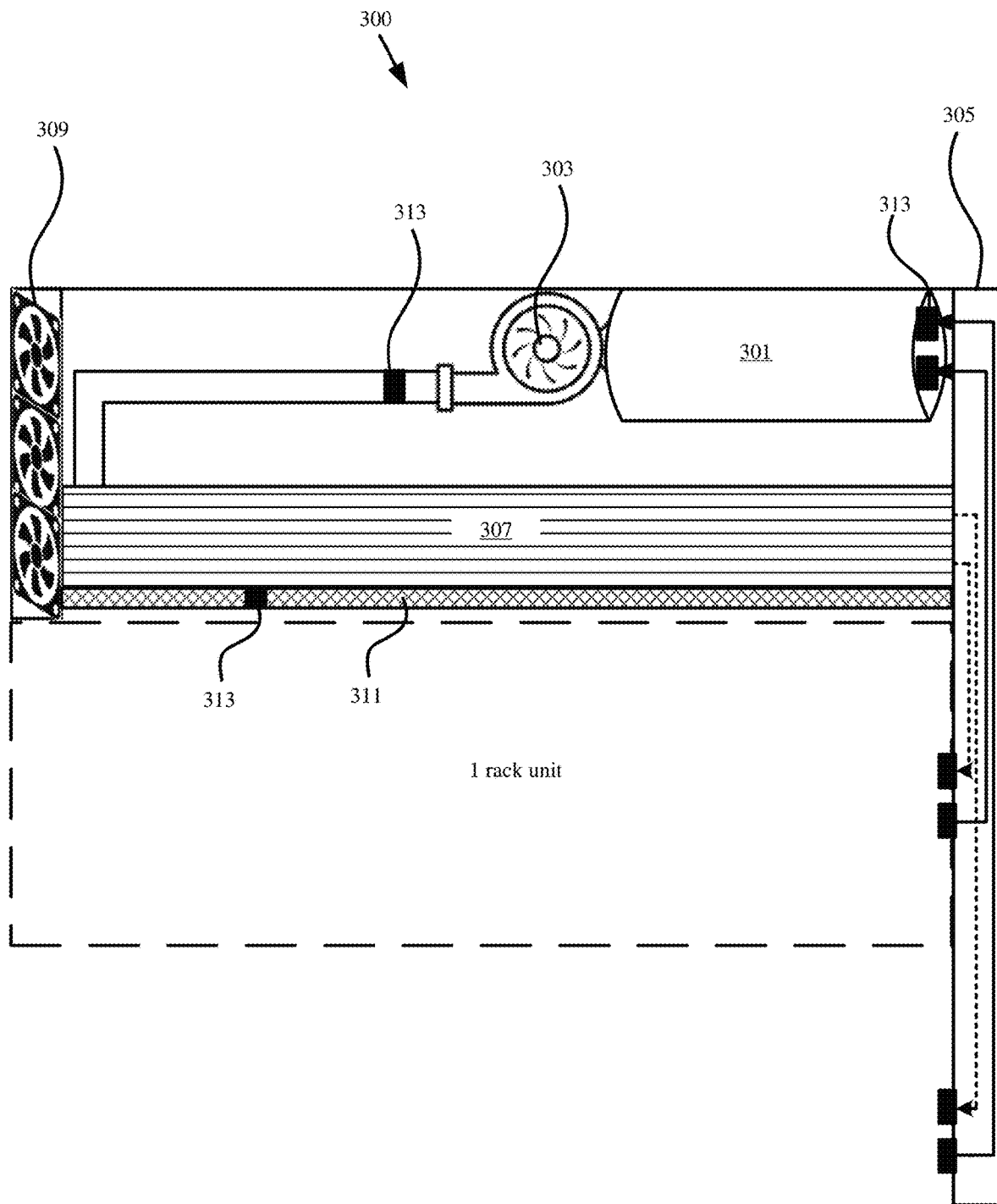
FIG. 3 illustrates an example architecture for a cooling unit in accordance with some embodiment presented herein.

FIG. 3 illustrates an example architecture for cooling unit 300 in accordance with some embodiment presented herein. Cooling unit 300 may also be housed within a blade, sled, tray, and/or other case with a 1U form factor. However, cooling unit 300 may be a full-length and full-width module that occupies an entire 1U slot of the rack or chassis, whereas each memory-dense compute unit 100 may be half-width such that two memory-dense compute units 100 may be placed side-by-side to occupy an entire 1U slot of the rack or chassis. In some embodiments, cooling unit 300 may be a larger 2U, 3U, or 4U form factor depending on the cooling requirements and/or number of memory-dense compute units 100 that are to be simultaneously cooled by cooling unit 300. Cooling unit 300 may include cooling solution reservoir 301, pump 303, manifold 305, radiator 307, one or more fans 309, belly pan 311, and one or more sensors 313.

Cooling solution reservoir 301 may include a tank or receptacle in which the cooling solution or liquid is stored. In some embodiment, the liquid within cooling solution reservoir 301 may be distilled water or a specialized liquid or gaseous coolant.

Reservoir 301 may be sized to contain at least enough cooling solution to route through tubing 113 of two or more memory-dense compute units 100 that may connect to cooling unit 300 via manifold 305. For instance, if manifold 305 contains four ports for connecting to four different memory-dense compute units 100 and each memory-dense compute unit 100 contains 10 feet of quarter-inch tubing 113, then reservoir 301 may be sized to contain more cooling solution than is necessary to flow through tubing 113 of all four memory-dense compute units 100.

Pump 303 may generate pressure for circulating the cooling solution from cooling solution reservoir 301 through radiator 307 to manifold 305 and across tubing 113 of one or more memory-dense compute units 100 that are connected to manifold 305. Pump 303 may operate at one speed or at variable speeds to generate different amounts of pressure or flow depending on the number of connected memory-dense compute units 100 or the temperature of the cooling solution returning to cooling unit 300. In some embodiments, one or more sensors 313 may measure the temperature of the cooling solution flowing back to cooling unit 300, and may adjust operation of pump 303 to increase or decrease the flow of the cooling solution based on the detected temperature.

Manifold 305 may include an extension that rises above and/or under cooling unit 300 from the rear of cooling unit 300. The extension may include one or more manifold interfaces for receiving cooling connector 107 of memory-dense compute unit 100 at rack or chassis slots below or above cooling unit 300. Each manifold interface may include a first port for supplying cooling solution to a connected memory-dense compute unit 100 (e.g., after the cooling solution is brought to an ambient or chilled temperature by radiator 307), and a second port for receiving the cooling solution after it has flowed through the connected memory-dense compute unit 100 and absorbed heat from the components therein.

In some embodiments, manifold 305 may include a downward extension that reaches 1U or 1.75 inches below cooling unit 300 to align two pairs of horizontally-aligned manifold interfaces with cooling connectors 107 of two side-by-side memory-dense compute units 100 that are inserted in the rack or chassis slot 1U directly below cooling unit 300. In some such embodiments, manifold 305 may also or alternatively include an upward extension that reaches 1U or 1.75 inches above cooling unit 300 to align two pairs of horizontally-aligned manifold interfaces with cooling connectors 107 of two side-by-side memory-dense compute units 100 inserted in the rack or chassis slot 1U directly above cooling unit 300.

In some embodiments, manifold 305 may include a downward extension that reaches 2U or 3.5 inches below cooling unit 300 with a first pair of manifold interfaces that align with cooling connectors 107 of side-by-side memory-dense compute units 100 in the slot (e.g., 1U) directly below cooling unit 300, and a second pair of manifold interfaces that align with cooling connectors 107 of side-by-side memory-dense compute units 100 two slots (e.g., 2U) under cooling unit 300. A similar extension with two pairs of manifold interfaces may extend upward from the rear of cooling unit 300 for simultaneous cooling of up to eight memory-dense compute units 100.

Radiator 307 may include a set of distributed fins that span the full length and width of cooling unit 300 or the 1U form factor. Radiator 307 may maximize the surface area across which the cooling solution returning from the connected memory-dense compute units 100 may be cooled via airflow. Specifically, the cooling solution received from memory-dense compute units 100 via manifold 305 may be pumped across radiator 307, and wind generated by one or more fans 309 may flow over radiator 307 to transfer heat away and out of cooling unit 300, thereby cooling the cooling solution within radiator 307 down to an ambient or lower temperature.

Belly pan 311 may be used to capture any of the cooling solution that leaks out from cooling solution reservoir 301, pump 303, radiator 307, and/or the tubing of cooling unit 300. One or more sensors 313 may include a leak detector to shut off cooling unit 300 and/or generate alerts in response to detecting liquid collecting in belly pan 311.

In some embodiments, cooling unit 300 may include other components or different components than those described with reference to FIG. 3. For instance, cooling unit 300 may include a power connector for connecting to an external power supply and/or receiving power for pump 303, one or more fans 309, etc. Manifold 305 may be modified to replace the vertical extension with the manifold interfaces with a box at the rear of cooling unit 300 that includes the manifold interfaces, and flexible tubing may be used to establish a water-tight connection between cooling connector 107 of each memory-dense compute unit 100 and the modified manifold 305 of cooling unit 300.

Figure 4:
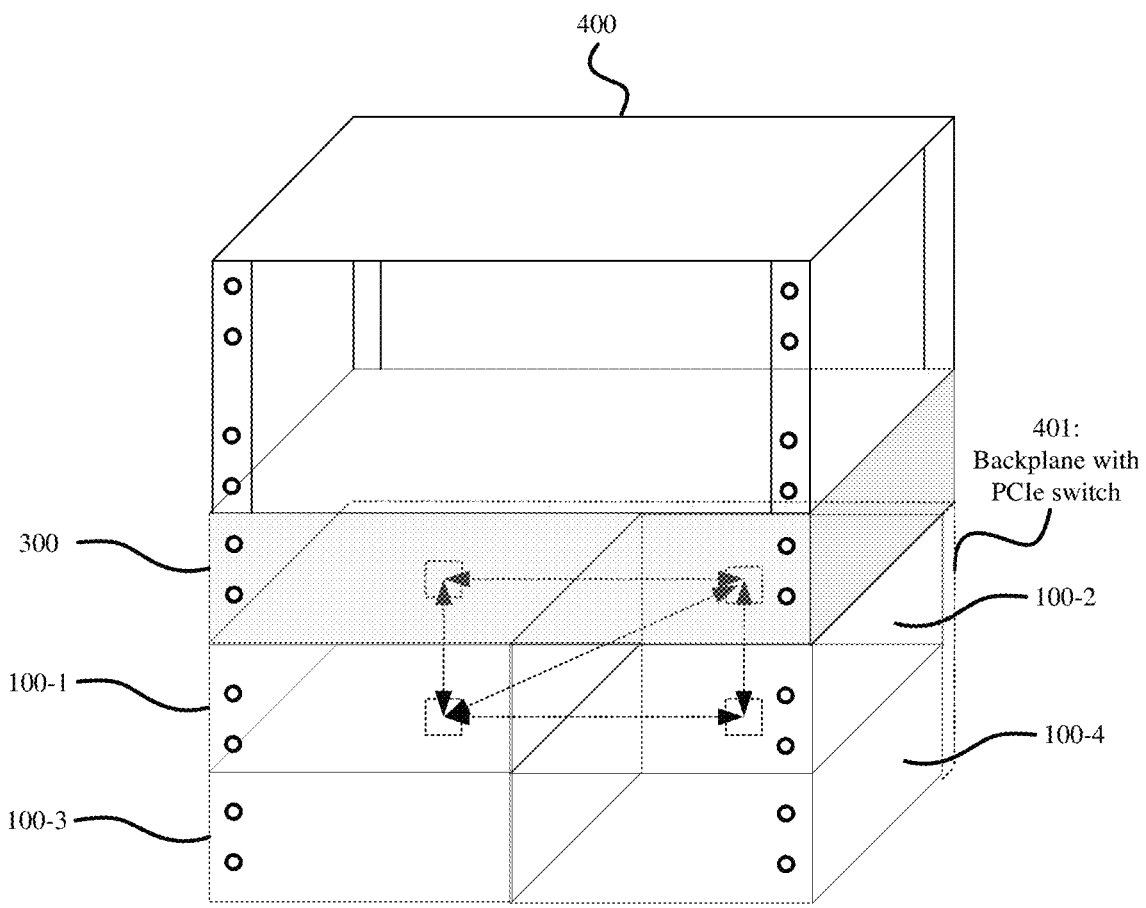
FIG. 4 illustrates a rack or chassis configured with four memory-dense compute units that are cooled by the cooling unit in accordance with some embodiments presented herein.

FIG. 4 illustrates rack or chassis 400 configured with four memory-dense compute units 100-1, 100-2, 100-3, and 100-4 (collectively referred to as memory-dense compute units 100 or individual referred to as memory-dense compute unit 100) and cooling unit 300 in accordance with some embodiments presented herein. Each of the memory-dense compute units 100 may be connected to the same CXL or PCIe switch 401 via their respective high-speed interconnect interface 111. CXL or PCIe switch 401 may be integrated in the backplane of rack or chassis 400, or may be a standalone device that is inserted into its own slot of rack or chassis 400. The CXL protocol may pool the memory from each memory-dense compute unit 100 together to allow any processor from the four memory-dense compute units 100 to directly access some or all of the memory via the PCIe link regardless of which memory-dense compute unit 100 hosts the memory. Accordingly, the four memory-dense compute unit 100 configuration illustrated in FIG. 4 may allocate 96 TBs of memory to a single application running on one or more processors 105 of memory-dense compute units 100-1, 100-2, 100-3, and 100-4.

Figure 5:
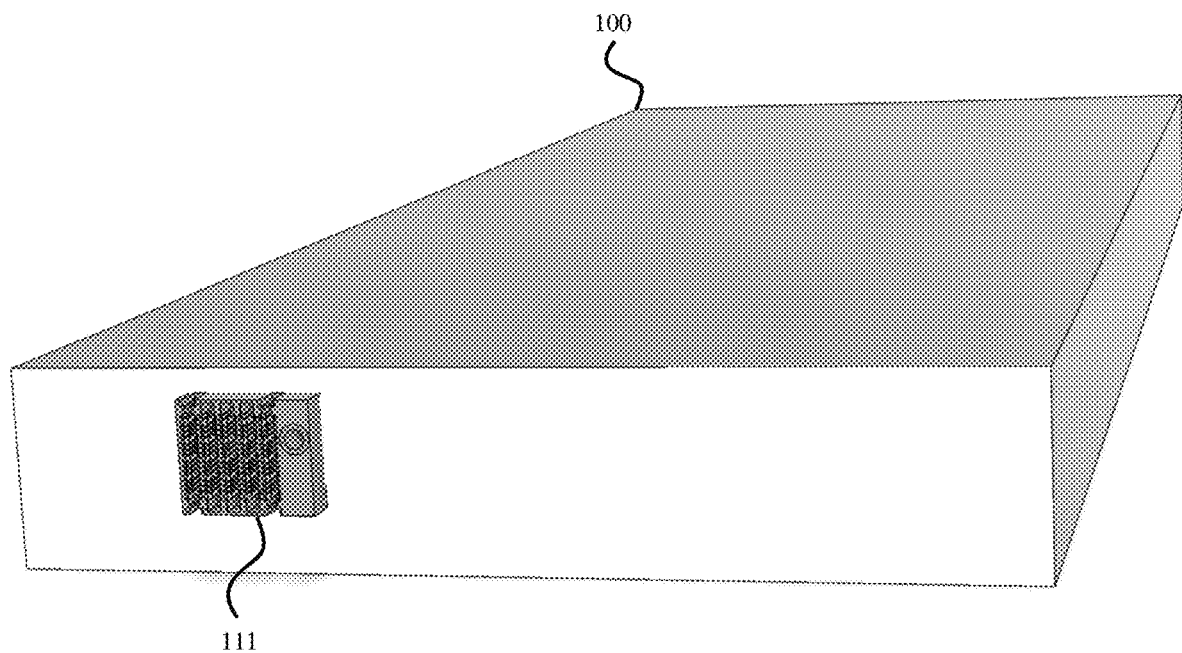
FIG. 5 provides a rear exterior view of the memory-dense compute unit in accordance with some embodiments presented herein.

FIG. 5 provides a rear exterior view of memory-dense compute unit 100 in accordance with some embodiments presented herein. As shown in FIG. 5, high-speed interconnect interface 111 may include a set of blind mate connectors that extend out from behind memory-dense compute 100. Cooling connector 107 may be located adjacent to high-speed interconnect interface 111 (not shown).

The set of blind mate connectors may engage with a panel mount wired harness about a chassis backplane. In particular, the set of blind mate connectors may be constructed with self-aligning features so that the blind mate connectors may guide themselves into the correct mating position with the panel mount wired harness about the chassis backplane. In some embodiments, the set of blind mate connectors may slide onto, snap on, and/or uses guided pins to connect to the panel mount wired harness.

Figure 6:
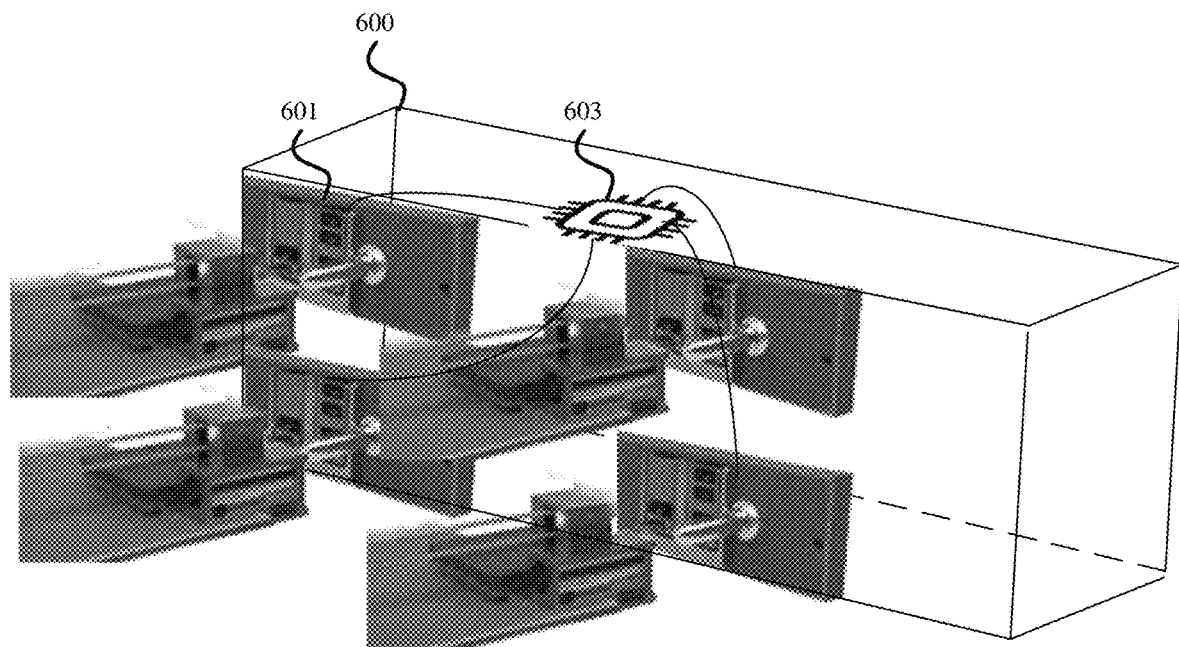
FIG. 6 illustrates a partial cutaway view of the chassis backplane with a panel mount wired harness in accordance with some embodiments presented herein.

FIG. 6 illustrates a partial cutaway view of chassis backplane 600 with a panel mount wired harness 601 that receives the set of blink mate connectors from four different memory-dense compute units 100. Panel mount wired harness 601 may connect the set of blind mate connectors to the backplane PCB and the PCIe/CXL switch integrated circuit ("IC") 603. Panel mount wired harness 601 may provide low frequency loss for the high speed signals passing over the PCIe bus and may reduce or eliminate the need for buffering and retimers on the PCIe bus. In particular, panel mount wired harness 601 may minimize the PCB trace lengths so a lower cost PCB material may be used on the backplane without adversely impacting the signal integrity of the high-speed data interfaces.

Figure 7:
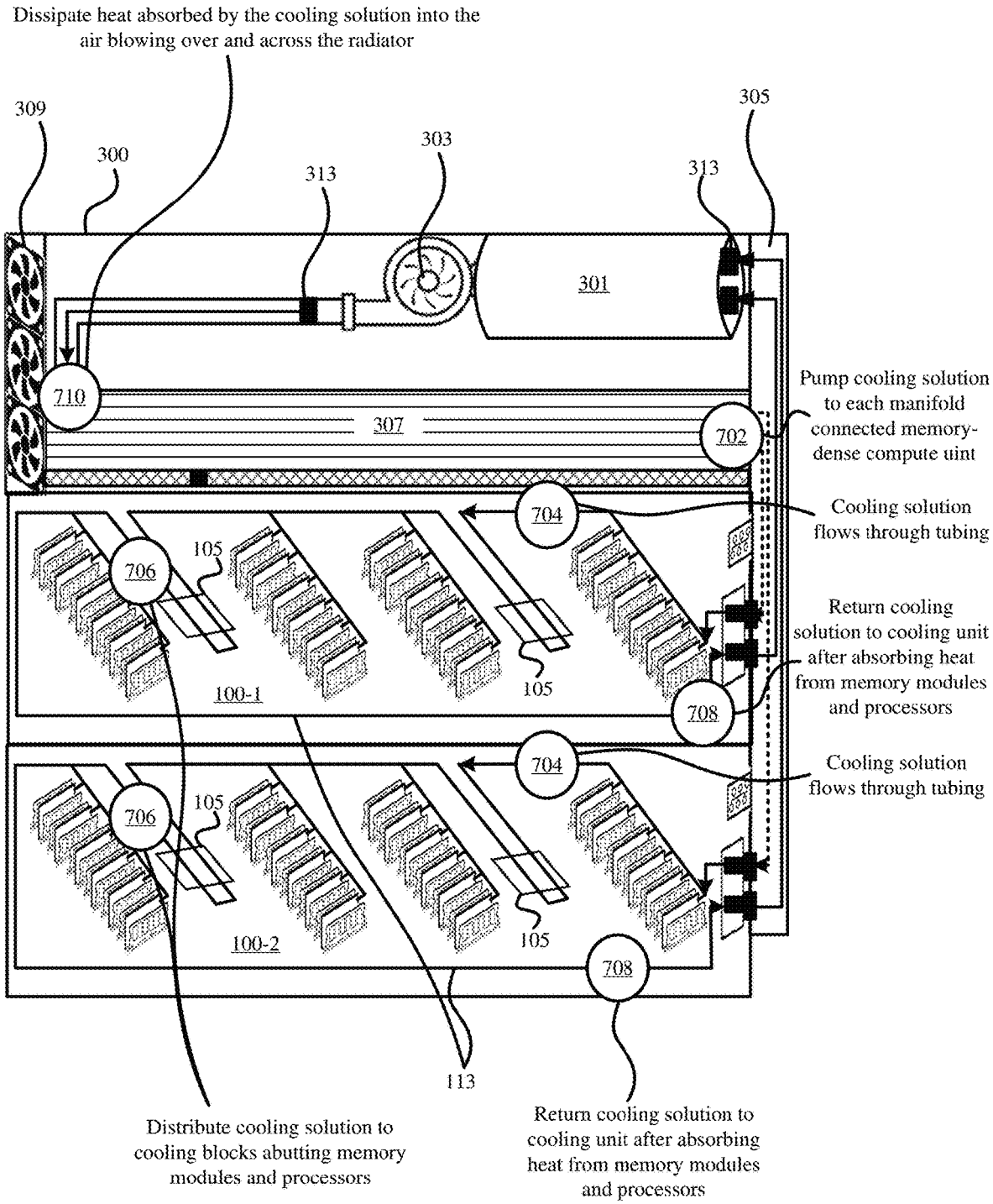
FIG. 7 illustrates example operation of the cooling unit cooling two memory-dense compute units in accordance with some embodiments presented herein.

FIG. 7 illustrates example operation of cooling unit 300 cooling two memory-dense compute units 100-1 and 100-2 in accordance with some embodiments presented herein. First memory-dense compute unit 100-1, second memory-dense compute unit 100-2, and cooling unit 300 may be inserted in three consecutive 1U slots of a rack or chassis, and may be connected to a backplane of the rack or chassis that has an integrated CXL or PCIe switch. Additionally, first and second memory-dense compute units 100 may connect to manifold 305 of cooling unit 300.

Cooling unit 300 may pump (at 702) the cooling solution to each memory-dense compute unit 100-1 and 100-2. The cooling solution enters each memory-dense compute unit 100-1 and 100-2 via cooling connector 107 and flows (at 704) through the integrated tubing 113. Tubing 113 distributes (at 706) the cooling solution across each cooling block 115 that is in contact with one or more memory modules or processors 105 of that memory-dense compute unit 100-1 or 100-2. Heat is transferred from the memory modules and processors 105 to the contacting surface of each cooling block 115, and is absorbed by the cooling solution flowing through each cooling block 115. The cooling solution flows (at 708) out of each memory-dense compute unit 100 and back into cooling unit 300. Specifically, the cooling solution enters manifold 305, is deposited into reservoir 301, and is then spread across radiator 307. The absorbed heat is dissipated (at 710) back into the air flowing over and across radiator 307. One or more fans 309 may expedite the cooling by increasing the volume of colder air that flows into cooling unit 300 and over radiator 307, and by increasing the volume of air that is warmed by the heat dissipating off radiator 307 that flows out of cooling unit 300.

Figure 8:
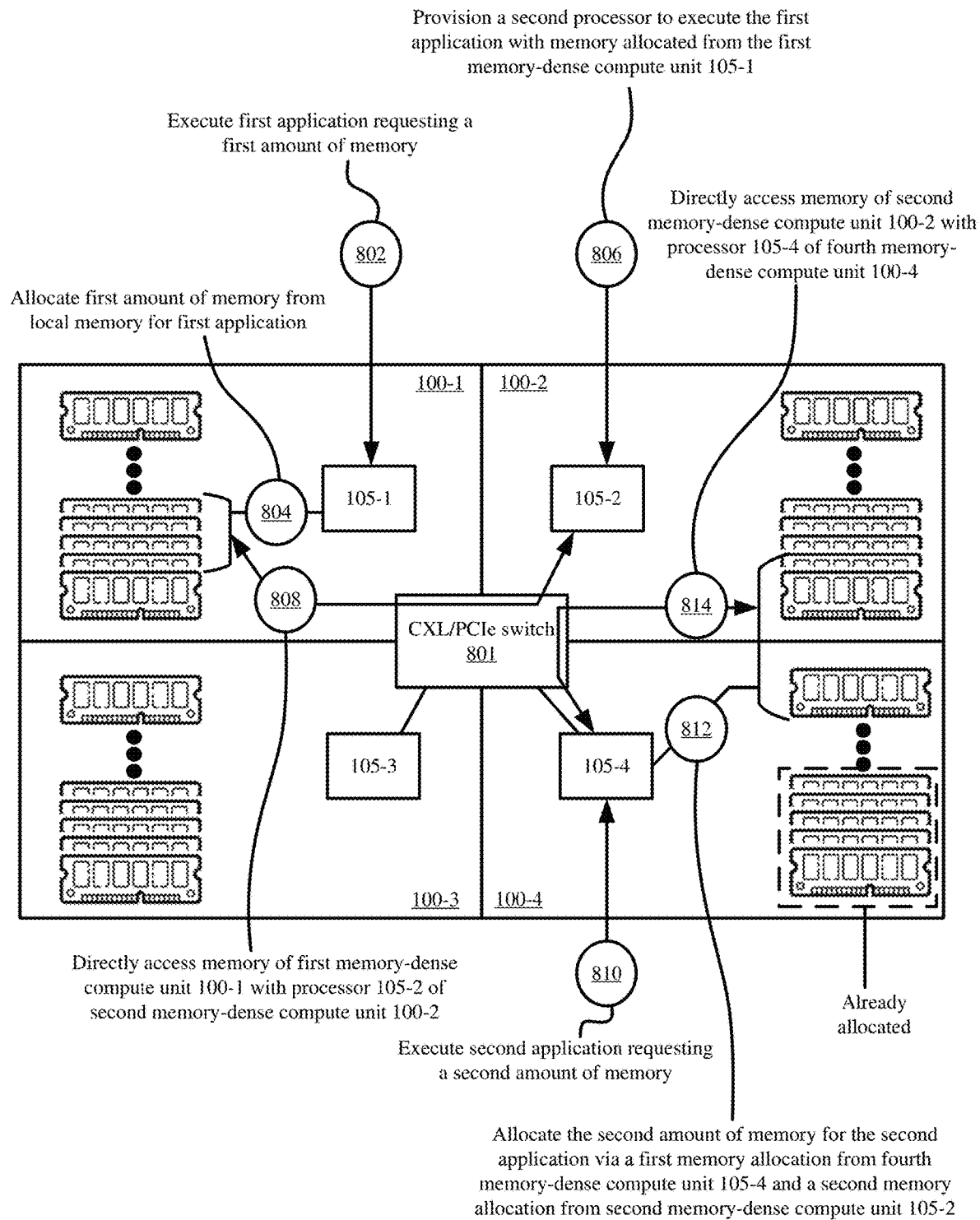
FIG. 8 illustrates the creation and accessing of a massive memory pool using the high-speed interconnectivity between four or more memory-dense compute units in accordance with some embodiments presented herein.

FIG. 8 illustrates the creation and accessing of a massive memory pool using the high-speed interconnectivity between four or more memory-dense compute units 100-1, 100-2, 100-3, and 100-4 in accordance with some embodiments presented herein. Memory-dense compute units 100 may be housed in the same rack or chassis, and may be connected to the same CXL or PCIe switch 801 via high-speed interconnect interface 111. CXL or PCIe switch 801 may be integrated in the rack or chassis backplane or may be a separate device that is added to the rack or chassis and that memory-dense compute units 100 are connected to.

CXL is a protocol that runs atop PCIe generation 5 links, and that establishes cache-coherent links between the connected memory-dense compute units 100. Specifically, first processor 105-1 on first memory-dense compute unit 100-1 may establish and maintain memory coherency with memory on other connected compute units 100-2, 100-3, and 100-4 with extremely low overhead and latency via the CXL protocol. First processor 105-1 may directly access the memory of other compute units 100-2, 100-3, and 100-4 as if the memory from other compute units 100-2, 100-3, and 100-4 was locally managed by first processor 105-1 of first connected compute unit 100-1. In other words, first processor 105-1 may perform remote memory load and/or store operations on memory of any memory-dense compute unit 100 that is connected to the same CXL or PCIe switch 801 as first connected compute unit 100-1.

Connected compute units 100-1, 100-2, 100-3, and 100-4 may use the CXL.io protocol of CXL for initialization, link-up, device discovery and enumeration, and register access. Connected compute units 100-1, 100-2, 100-3, and 100-4 may use the CXL.cache protocol to define interactions between each processor 105 and the memory of other connected compute units 100, and/or the CXL.memory protocol to provide each processor 105 with direct access to the memory of other connected compute units 100.

As shown in FIG. 8, first processor 105-1 on first memory-dense compute unit 100-1 may be tasked (at 802) with running a first application. The first application may request a first allocation of memory that first 105-1 obtains (at 804) and/or allocates from the memory of first memory-dense compute unit 100-1.

Second processor 105-2 on second memory-dense compute unit 100-2 may be tasked (at 806) with running the first application in conjunction with first processor 105-1. For instance, the first application may require more processing power or cores than are offered by first processor 105-1 alone. Accordingly, second processor 105-2 may be provisioned to execute the first application in conjunction with first processor 105-1 using the single block of memory that is allocated (at 804) for the first application. Rather than transfer the data of the first application from the allocated memory of first memory-dense compute unit 100-1 to the local memory of second memory-dense compute unit 100-2 before it is processed, second processor 105-2 may directly access (at 808) the allocated memory of first memory-dense compute unit 100-1 in executing the first application alongside first processor 105-1. In other words, both first processor 105-1 of first memory-dense compute unit 100-1 and second processor 105-2 of second memory-dense compute unit 100-2 may perform load, store, and read operations directly to the allocated memory from first memory-dense compute unit 100-1 based on the memory coherency and direct access provided by the CXL protocol and the low-latency high-speed interconnection of the PCIe links created between the connected compute units 100 by CXL or PCIe switch 801.

Fourth processor 105-4 on fourth memory-dense compute unit 100-4 may be tasked (at 810) with running a second application that requires more memory than is available on fourth memory-dense compute unit 100-4 due to prior memory allocations. Accordingly, fourth processor 105-4 may allocate (at 812) a first block of memory from the remaining memory of fourth memory-dense compute unit 100-4, and may allocate (at 812) a second block of memory from memory of second memory-dense compute unit 100-2 in order to run the second application. The PCIe link between connected memory-dense compute units 100-1, 100-2, 100-3, and 100-4 provides sufficient bandwidth with which fourth processor 105-4 may access the local and remote memory with insignificant difference in the access times. Moreover, the CXL protocols allow fourth processor 105-4 to directly access (at 814) the remote memory of second memory-dense compute unit 100-2. Specifically, fourth processor 105-4 may bypass second processor 105-2 in order to directly access, load, store, and read from the allocated remote memory of second memory-dense compute unit 100-2, and may perform the memory access operations without having to first transfer the data from the remote memory of second memory-dense compute unit 100-2 to local memory of fourth memory-dense compute unit 100-4. In this manner, fourth processor 105-4 may directly access (at 814) the remote memory of second memory-dense compute unit 100 in the same manner and with the same performance profile as the locally allocated memory from fourth memory-dense compute unit 100-4.

Figure 9:
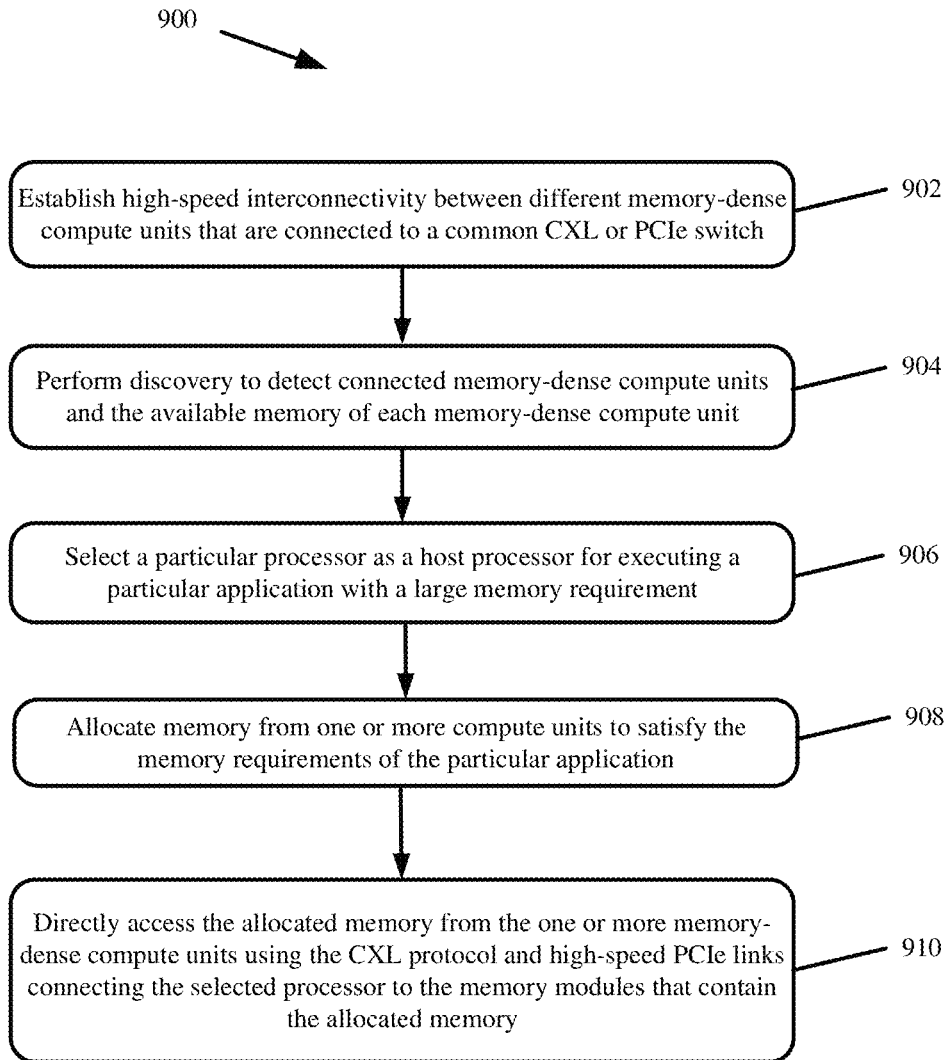
FIG. 9 presents a process for providing a massive memory allocation via high-speed interconnected high-density memory arrangements in accordance with some embodiments presented herein.

FIG. 9 presents a process 900 for providing a massive memory allocation via high-speed interconnected high-density memory arrangements in accordance with some embodiments presented herein. Process 900 may be implemented by a system comprised of one or more PCIe linked and/or CXL interconnected memory-dense compute units 100 that receive cooling from cooling unit 300.

Process 900 may include establishing (at 902) high-speed interconnectivity between two or more memory-dense compute units 100 that are connected to a common CXL or PCIe switch. Establishing (at 902) the high-speed interconnectivity may include provisioning a number of PCIe lanes with which each compute unit 100 connects to the CXL or PCIe switch and/or communicates with the other connected compute units 100 or devices. In some embodiments, the CXL or PCIe switch may support 144 or more PCIe lanes, and may allocate 32 PCIe lanes to each connected memory-dense compute unit 100. Unused PCIe lanes may be used to link the switch to other switches that interconnect other memory-dense compute units 100.

Process 900 may include performing (at 904) discovery to detect each memory-dense compute unit 100 that is connected to the CXL or PCIe switch, and to detect the available memory of each compute unit 100. The discovery may be implemented according to one or more of the CXL protocols.

Process 900 may include selecting (at 906) a particular processor as a host processor for executing a particular application with a large memory requirement. In some embodiments, the system may select (at 906) whichever is the least loaded processor for execution of the particular application or the associated task, or may select (at 906) whichever processor is compatible with the particular application or the associated task. For instance, the task may involve rendering an image, and selecting (at 906) the particular processor may include selecting an available GPU over an available CPU or other processor for the task.

Process 900 may include allocating (at 908) memory from one or more compute units to satisfy the memory requirements of the particular application. In some embodiments, the memory may be first allocated from the local memory of the memory-dense compute unit 100 where the selected processor is located, and supplementing the allocation with memory from one or more interconnected memory-dense compute units 100 if more memory is required. The host processor may directly allocate memory from remote memory-dense compute units 100 using the CXL protocol, and the CXL protocol may maintain memory coherency with other processors that attempt to access the same memory.

Process 900 may include directly accessing (at 910) the allocated memory from the one or more memory-dense compute units 100 using the CXL protocol and high-speed PCIe links connecting the selected processor to the memory modules that contain the allocated memory. Accordingly, the selected processor may execute the particular execution by loading and storing data directly into the allocated memory regardless of the memory being local or remote to the selected processor.

Figure 10:
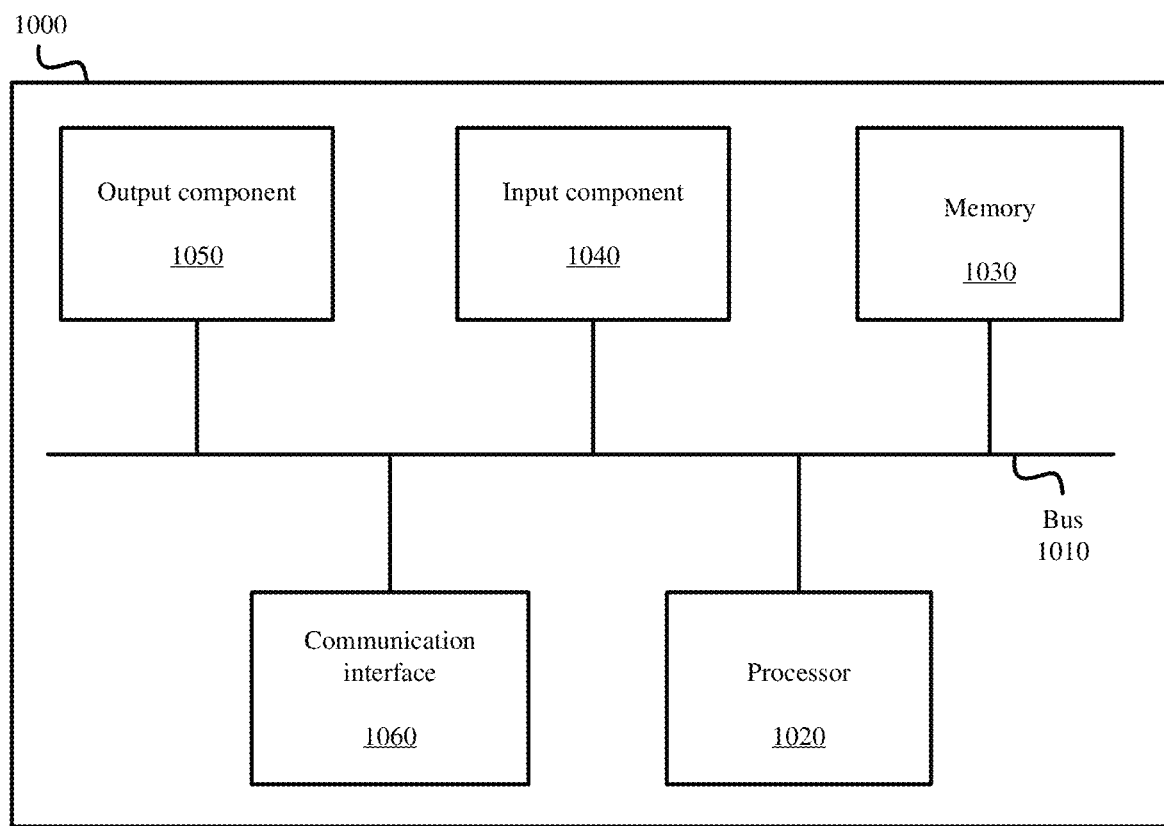
FIG. 10 illustrates example components of one or more devices, according to one or more embodiments described herein.

FIG. 10 is a diagram of example components of device 1000. Device 1000 may be used to implement one or more of the devices or systems described above (e.g., memory-dense compute unit 100, cooling unit 300, etc.). Device 1000 may include bus 1010, processor 1020, memory 1030, input component 1040, output component 1050, and communication interface 1060. In another implementation, device 1000 may include additional, fewer, different, or differently arranged components.

Bus 1010 may include one or more communication paths that permit communication among the components of device 1000. Processor 1020 may include a processor, microprocessor, or processing logic that may interpret and execute instructions. Memory 1030 may include any type of dynamic storage device that may store information and instructions for execution by processor 1020, and/or any type of non-volatile storage device that may store information for use by processor 1020.

Input component 1040 may include a mechanism that permits an operator to input information to device 1000, such as a keyboard, a keypad, a button, a switch, etc. Output component 1050 may include a mechanism that outputs information to the operator, such as a display, a speaker, one or more LEDs, etc.

Communication interface 1060 may include any transceiver-like mechanism that enables device 1000 to communicate with other devices and/or systems. For example, communication interface 1060 may include an Ethernet interface, an optical interface, a coaxial interface, or the like. Communication interface 1060 may include a wireless communication device, such as an infrared ("IR") receiver, a Bluetooth® radio, or the like. The wireless communication device may be coupled to an external device, such as a remote control, a wireless keyboard, a mobile telephone, etc. In some embodiments, device 1000 may include more than one communication interface 1060. For instance, device 1000 may include an optical interface and an Ethernet interface.

Device 1000 may perform certain operations relating to one or more processes described above. Device 1000 may perform these operations in response to processor 1020 executing software instructions stored in a computer-readable medium, such as memory 1030. A computer-readable medium may be defined as a non-transitory memory device. A memory device may include space within a single physical memory device or spread across multiple physical memory devices. The software instructions may be read into memory 1030 from another computer-readable medium or from another device. The software instructions stored in memory 1030 may cause processor 1020 to perform processes described herein. Alternatively, hardwired circuitry may be used in place of or in combination with software instructions to implement processes described herein. Thus, implementations described herein are not limited to any specific combination of hardware circuitry and software.

The foregoing description of implementations provides illustration and description, but is not intended to be exhaustive or to limit the possible implementations to the precise form disclosed. Modifications and variations are possible in light of the above disclosure or may be acquired from practice of the implementations.

The actual software code or specialized control hardware used to implement an embodiment is not limiting of the embodiment. Thus, the operation and behavior of the embodiment has been described without reference to the specific software code, it being understood that software and control hardware may be designed based on the description herein.

For example, while series of messages, blocks, and/or signals have been described with regard to some of the above figures, the order of the messages, blocks, and/or signals may be modified in other implementations. Further, non-dependent blocks and/or signals may be performed in parallel. Additionally, while the figures have been described in the context of particular devices performing particular acts, in practice, one or more other devices may perform some or all of these acts in lieu of, or in addition to, the above-mentioned devices.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

Further, while certain connections or devices are shown, in practice, additional, fewer, or different, connections or devices may be used. Furthermore, while various devices and networks are shown separately, in practice, the functionality of multiple devices may be performed by a single device, or the functionality of one device may be performed by multiple devices. Further, while some devices are shown as communicating with a network, some such devices may be incorporated, in whole or in part, as a part of the network.

To the extent the aforementioned embodiments collect, store or employ personal information provided by individuals, it should be understood that such information shall be used in accordance with all applicable laws concerning protection of personal information. Additionally, the collection, storage and use of such information may be subject to consent of the individual to such activity, for example, through well-known "opt-in" or "opt-out" processes as may be appropriate for the situation and type of information. Storage and use of personal information may be in an appropriately secure manner reflective of the type of information, for example, through various encryption and anonymization techniques for particularly sensitive information.

Some implementations described herein may be described in conjunction with thresholds. The term "greater than" (or similar terms), as used herein to describe a relationship of a value to a threshold, may be used interchangeably with the term "greater than or equal to" (or similar terms). Similarly, the term "less than" (or similar terms), as used herein to describe a relationship of a value to a threshold, may be used interchangeably with the term "less than or equal to" (or similar terms). As used herein, "exceeding" a threshold (or similar terms) may be used interchangeably with "being greater than a threshold," "being greater than or equal to a threshold," "being less than a threshold," "being less than or equal to a threshold," or other similar terms, depending on the context in which the threshold is used.

No element, act, or instruction used in the present application should be construed as critical or essential unless explicitly described as such. An instance of the use of the term "and," as used herein, does not necessarily preclude the interpretation that the phrase "and/or" was intended in that instance. Similarly, an instance of the use of the term "or," as used herein, does not necessarily preclude the interpretation that the phrase "and/or" was intended in that instance. Also, as used herein, the article "a" is intended to include one or more items, and may be used interchangeably with the phrase "one or more." Where only one item is intended, the terms "one," "single," "only," or similar language is used. Further, the phrase "based on" is intended to mean "based, at least in part, on" unless explicitly stated otherwise.

The invention claimed is:

1. A cooling unit for a rack or chassis comprising a plurality of slots in a one rack unit (1U) form factor, the cooling unit comprising:
   a reservoir storing a solution;
   a radiator;
   a manifold comprising a plurality of ports;
   tubing comprising different segments that pass the solution from the reservoir to the radiator and from the radiator to the manifold;
   a pump that circulates the solution from the reservoir through said tubing; and
   a case with a 1U form factor in which the reservoir, the radiator, the manifold, and the pump are housed.

2. The cooling unit of claim 1, wherein the case is a blade or sled that slides into and occupies one slot of the plurality of slots from the rack or chassis.

3. The cooling unit of claim 1, wherein the manifold further comprises:
   an extension that extends 1U above or below the cooling unit, and wherein the plurality of ports are located about an end of the extension that extends 1U above or below the cooling unit.

4. The cooling unit of claim 1, wherein the plurality of ports comprises:
   a first port that passes the solution circulated by the pump to a first connector of a particular unit disposed in a slot of the rack or chassis that is 1U or 2U above or below the cooling unit; and
   a second port that receives the solution from a second connector of the particular unit after the solution is used to cool components of the particular unit.

5. The cooling unit of claim 1, wherein the plurality of ports comprises:
   a first pair of ports that establish a pathway through which the solution is passed to and received from a first unit with a half-width 1U form factor in a first half of a particular slot of the plurality of slots; and
   a second pair of ports that establish a pathway through which the solution is passed to and received from a second unit with a half-width 1U form factor in a second half of the particular slot.

6. The cooling unit of claim 1, wherein the plurality of ports comprises:
   at least a first port that connects to the reservoir with or without a segment of the tubing and that deposits the solution entering the cooling unit from an externally connected device into the reservoir; and
   at least a second port that connects to the radiator with or without a segment of the tubing and that passes the solution that has been cooled by the radiator out the cooling unit to the externally connected device.

7. The cooling unit of claim 1 further comprising:
   one or more sensors that measure a temperature of the solution; and
   wherein the pump is a variable speed pump that increases or decreases a flow of the solution based on the temperature measured by the one or more sensors.

8. The cooling unit of claim 1, wherein the radiator comprises:
   a set of distributed fins that remove heat from the solution as the solution passes through the radiator.

9. The cooling unit of claim 8 further comprising:
   one or more fans that circulate air over the set of distributed fins.

10. The cooling unit of claim 1 further comprising:
   a first flexible tube through which the solution exits the cooling unit from a first port of the plurality of ports after the solution is cooled by the radiator; and
   a second flexible tube through which the solution enters the cooling unit from a second port of the plurality of ports that the solution is warmed by another device.

11. The cooling unit of claim 1 further comprising:
one or more leak detecting sensors, wherein the one or more leak detecting sensors generate an alert in response to detecting the solution leaking from one or more of the reservoir, radiator, manifold, tubing, or pump.

12. The cooling unit of claim 11, wherein the one or more leak detecting sensors shut off the cooling unit in response to detecting the solution leaking.

13. The cooling unit of claim 1, wherein the manifold further comprises:
a box disposed at a rear of the case with the plurality of ports protruding out and away from the case.

14. The cooling unit of claim 1, wherein the reservoir, the radiator, the manifold, and the pump housed in the case do not extend more than 1.75 inches or 1U above a bottom of the case.

15. The cooling unit of claim 1, wherein each port of the plurality of ports is a dripless connector that establishes a water-tight connection with flexible tubing that is inserted over the port.

16. The cooling unit of claim 1, wherein the plurality of ports support a cooling or heat removal from four different devices disposed in two or more of the plurality of slots above or below the cooling unit.

17. A cooling apparatus comprising:
a sled with a full-width one rack unit (1U) form factor;
a reservoir at a first end of the sled containing a liquid or gaseous coolant;
a first set of two or more ports at the first end of the sled that feed into a first side of the reservoir;
a pump connected to a second side of the reservoir, wherein the pump pumps the liquid or gaseous coolant out from the reservoir;
a radiator;
tubing that supplies the liquid or gaseous coolant pumped out from the reservoir through the radiator; and
a second set of two or more ports at the first end of the sled through which the liquid or gaseous coolant exits the cooling apparatus.

18. The cooling apparatus of claim 17, wherein the first set of two or more ports receive the liquid or gaseous coolant after it has passed through and been warmed by operation of two or more distinct devices located in different slots of a rack or chassis than the cooling apparatus.

19. The cooling apparatus of claim 18, wherein the second set of two or more ports supply the liquid or gaseous coolant after it has been cooled by the radiator to the two or more distinct devices.

20. The cooling apparatus of claim 17, wherein a height of the cooling apparatus is equal to or less than 1.75 inches.

* * * * *